(12) United States Patent
Perrott

(10) Patent No.: US 11,632,116 B2
(45) Date of Patent: Apr. 18, 2023

(54) CALIBRATION OF PARAMETRIC ERROR OF DIGITAL-TO-TIME CONVERTERS

(71) Applicant: TEXAS INSTRUMENTS INCORPORATED, Dallas, TX (US)

(72) Inventor: Michael Henderson Perrott, Nashua, NH (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/573,323

(22) Filed: Jan. 11, 2022

(65) Prior Publication Data
US 2022/0224344 A1 Jul. 14, 2022

Related U.S. Application Data

(60) Provisional application No. 63/136,243, filed on Jan. 12, 2021.

(51) Int. Cl.
*H03L 7/087* (2006.01)
*H03L 7/197* (2006.01)

(52) U.S. Cl.
CPC ............ *H03L 7/087* (2013.01); *H03L 7/1976* (2013.01)

(58) Field of Classification Search
CPC .............................. H03L 7/1976; H03L 7/087
See application file for complete search history.

(56) References Cited

U.S. PATENT DOCUMENTS

| | | | |
|---|---|---|---|
| 8,860,514 B2 | 10/2014 | Weltin-Wu et al. | |
| 8,994,573 B2 | 3/2015 | Henzler et al. | |
| 9,455,667 B2 * | 9/2016 | Vlachogiannakis | H03M 1/002 |
| 9,678,481 B1 | 6/2017 | Gao et al. | |
| 10,511,315 B1 * | 12/2019 | Sarda | H03K 23/667 |
| 10,594,329 B1 * | 3/2020 | Elkholy | H03L 7/093 |
| 10,707,883 B2 | 7/2020 | Elkholy | |
| 10,819,353 B1 * | 10/2020 | Monk | H03L 7/23 |
| 10,826,507 B1 * | 11/2020 | Gong | H03L 7/183 |

(Continued)

FOREIGN PATENT DOCUMENTS

| | | | | |
|---|---|---|---|---|
| CN | 114710154 A | * | 7/2022 | |
| EP | 2782255 A1 | * | 9/2014 | ............... H03L 7/16 |
| KR | 20220023196 A | * | 3/2022 | |

OTHER PUBLICATIONS

Hung, Szu-Yao et al., "16.4 A 0.5-to-2.5GHz Multi-Output Fractional Frequency Synthesizer with 90fs Jitter and -106dBc Spurious Tones Based on Digital Spur Cancellation" 2019 IEEE International Solid-State Circuits Conference, Session 16, Feb. 19, 2019, pp. 262-263, US.

(Continued)

*Primary Examiner* — Adam D Houston
(74) *Attorney, Agent, or Firm* — Frank D. Cimino

(57) ABSTRACT

In some examples, a circuit includes a clock divider and a calibration circuit coupled to the clock divider. The clock divider includes digital-to-time converter (DTC). The calibration circuit configured to determine a gain error and a parametric integrated nonlinearity (INL) error of the DTC, determine a gain adjustment value and a INL adjustment value to compensate for the gain error and the INL error, and modify operation of the DTC according to the gain adjustment value and the INL adjustment value to correct for the gain error and the INL error.

20 Claims, 12 Drawing Sheets

(56) References Cited

U.S. PATENT DOCUMENTS

| | | | |
|---|---|---|---|
| 10,895,850 B1* | 1/2021 | Elkholy | G04F 10/005 |
| 11,201,626 B1* | 12/2021 | Jung | H03L 7/0891 |
| 11,271,584 B2* | 3/2022 | Choi | H03K 5/131 |
| 11,387,833 B1* | 7/2022 | Li | G04F 10/005 |
| 2008/0001642 A1* | 1/2008 | Yun | H03L 7/0812 |
| | | | 327/161 |
| 2008/0042766 A1* | 2/2008 | Tarng | H03L 7/1976 |
| | | | 331/167 |
| 2009/0015338 A1* | 1/2009 | Frey | H03L 7/1976 |
| | | | 327/156 |
| 2010/0183091 A1* | 7/2010 | Wang | H04L 27/0014 |
| | | | 375/296 |
| 2011/0148488 A1* | 6/2011 | Lee | H03L 7/093 |
| | | | 327/159 |
| 2013/0223564 A1* | 8/2013 | Mayer | H04L 27/2032 |
| | | | 375/295 |
| 2016/0373120 A1 | 12/2016 | Caffee et al. | |
| 2020/0076440 A1* | 3/2020 | Ng | H03L 7/1974 |
| 2022/0014208 A1* | 1/2022 | Choi | H03M 3/322 |
| 2022/0224344 A1* | 7/2022 | Perrott | H03L 7/1976 |
| 2022/0224348 A1* | 7/2022 | Perrott | H03L 7/1072 |

OTHER PUBLICATIONS

Wang, Bindi et al., "A Digital to Time Converter with Fully Digital Calibration Scheme for Ultra-Low Power ADPLL in 40 nm CMOS", 2015 IEEE International Symposium on Circuits and Systems (ISCAS), May 24-27, 2015, pp. 2289-2292, Portugal.

Wu, Wanghua et al., "A 28-nm 75-fsrms Analog Fractional-N Sampling PLL With a Highly Linear DTC Incorporating Background DTC Gain Calibration and Reference Clock Duty Cycle Correction", IEEE Journal of Solid-State Circuits, vol. 54, Issue 5, May 2019, pp. 1254-1265, US.

Search Report for PCT Patent Application No. PCT/US2022/012085 date of mailing of the international search report dated Apr. 7, 2022 (Apr. 7, 2022), 1 page.

* cited by examiner

CALIBRATION OF PARAMETRIC ERROR OF DIGITAL-TO-TIME CONVERTERS

CROSS-REFERENCE TO RELATED APPLICATIONS

This application claims priority to U.S. Provisional Patent Application No. 63/136,243, which was filed Jan. 12, 2021, and is hereby incorporated herein by reference in its entirety.

BACKGROUND

Various electrical components in an electronic system operate at different clock frequencies. As a result, a first clock signal having a first frequency may be divided to form a second clock signal having a second frequency. Some approaches to performing this division may be limited in their usefulness.

SUMMARY

In some examples, a circuit includes a multi-modulus (MM) divider, a delta-sigma modulator, a digital-to-time converter (DTC), and a calibration circuit. The MM divider has a first input configured to receive an input clock signal, a second input, and an output. The delta-sigma modulator has a first input configured to receive a divide value, a second input coupled to the output of the MM divider, a first output coupled to the second input of the MM divider, and a second output. The DTC has a first input, a second input, a third input, and an output, the first input coupled to the output of the MM divider, the second input coupled to the second output of the delta-sigma modulator. The calibration circuit has a first input coupled to the DTC output, a second input coupled to the second delta-sigma modulator, and an output coupled to the third DTC input.

In some examples, a circuit includes a clock divider and a calibration circuit coupled to the clock divider. The clock divider includes digital-to-time converter (DTC). The calibration circuit configured to determine a gain error and a parametric integrated nonlinearity (INL) error of the DTC, determine a gain adjustment value and a INL adjustment value to compensate for the gain error and the INL error, and modify operation of the DTC according to the gain adjustment value and the INL adjustment value to correct for the gain error and the INL error.

In some examples, a system includes a controller, a clock divider, a calibration circuit, and a component. The controller is configured to provide a control signal. The clock divider is coupled to the controller, and includes a DTC configured to modify a received clock signal according to the control signal to form a modified clock signal. The calibration circuit is coupled to the clock divider. The calibration circuit is configured to determine a gain error and a parametric integrated nonlinearity (INL) error of the DTC, determine a gain adjustment value and a INL adjustment value to compensate for the gain error and the INL error, and modify operation of the DTC according to the gain adjustment value and the INL adjustment value to correct for the gain error and the INL error. The component is coupled to the clock divider and configured to receive the modified clock signal from the clock divider and operate according to the modified clock signal.

DETAILED DESCRIPTION

Figure 1:
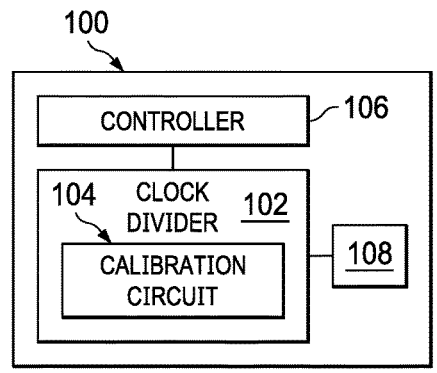
FIG. 1 is a block diagram of an electronic device, in accordance with various examples.

Some approaches to clock division exist, such as integer frequency division. However, integer frequency division may be limited in its usefulness due to an integer relationship existing between input and output clock signals which limits a resolution of selectable output clock signal frequencies. To avoid such limits on output frequency resolution, one solution is the implementation of a fractional output divider (FOD). A fractional output divider dynamically varies its divide value in time for dividing an input clock signal such that the average divided clock frequency is not constrained to an integer relationship between input and divided clock signals, where the divided clock signal has an average frequency corresponding to a programmed value. However, the dynamically varying divide value can lead to instantaneous phase error in the divided clock signal, which can result in jitter in the divided clock signal. The jitter may be considered instantaneous variations in time between rising edges of the divided clock signal and corresponding rising edges of an ideal clock signal having a frequency that is the same as the average frequency of the divided clock signal.

In some examples, the ideal clock signal is a clock signal that is periodic (e.g., each clock cycle has a same period). The phase error may cause the divided clock to have periods that vary from clock cycle to clock cycle and do not match the period of the ideal clock signal. The mismatch may be corrected, such as by a digital-to-time converter (DTC) modifying the divided clock signal according to a residual error signal that quantifies the phase or time error between the input and divided clock signal. However, implementations of the DTC can introduce correction errors as the DTC modifies the divided clock signal to cancel the residual error signal due to the dynamic variation of the divide value. Such correction errors include gain error, parametric integrated nonlinearity (INL) error, and mismatch error. Gain error corresponds to an error in a full-scale range in time of the DTC compared to an ideal full-scale range corresponding to an input clock period or an integer multiple of the input clock period. INL corresponds to error under an assumption of zero gain error that can be described as a function of the input residue that controls the DTC. Mismatch error corresponds to error of individual settings of the input residue that is not readily amenable to being described as a function of the input residue that controls the DTC.

Because the mismatch error is not readily amenable to being described as a function of the input residue that controls the DTC, correction of the mismatch error is sometimes performed via a look up table (LUT). In examples in which the mismatch error is relatively stable across temperature variations, the measurements and calculations to determine the entry values of the LUT can be performed offline. In such examples, the remaining errors of concern are gain error and INL error, which can vary significantly with temperature. Therefore, gain error and INL error may be corrected in a substantially continuous manner, rather than offline. In some examples, the correction of gain error and INL error in a continuous manner is accompanied by offline calibration of mismatch error via a LUT.

Examples of this description provide a circuit useful to correct for gain and INL error introduced in forming a clock signal. For example, circuits of this description may estimate gain and INL error values, determine gain and INL adjustment values, and modify the DTC gain and INL according to the gain and INL adjustment values to calibrate the gain and INL errors of the DTC such that their impact on the output clock signal is reduced. In some examples, such calibration may provide for an output clock signal that is periodic in nature, being approximately equivalent to an ideal clock signal, while avoiding the constraint of an integer relationship between input and output clock signals and mitigating effects of gain or INL error introduced into the output clock signal in the process of forming the output clock signal.

FIG. 1 is a block diagram of an electronic device 100, in accordance with various examples. The electronic device 100 may be any suitable device, the scope of which is not limited herein. For example, the electronic device 100 may be a device in which it is useful to have a second clock signal having a second frequency that varies from a first frequency of a first clock signal, such as via frequency division techniques or frequency multiplication techniques. Accordingly, the electronic device 100 includes a clock divider 102. The clock divider 102 may be of various forms, such as a FOD. The FOD may be implemented in an open loop context, such as a frequency divider, or in a closed loop context, such as within a phase-locked loop. The clock divider 102 includes a calibration circuit 104. In various examples, the calibration circuit 104 estimates, calculates, or otherwise determines an error of, or associated with, the clock divider 102, determines an adjustment value based on the error, and corrects such error through correction or calibration of the clock divider 102 based on the adjustment value.

The electronic device 100 also includes a controller 106. The controller 106 may couple to the clock divider 102 and/or the calibration circuit 104 and provide various control signals or other data to the clock divider 102 and/or the calibration circuit 104. The signals may include at least a reference clock (e.g., the input clock for the clock divider 102) and a frequency to which the clock divider 102 is to divide the input clock (or a value by which the clock divider 102 is to divide the input clock) to form the output clock. In other examples, the reference clock is provided by another component (not shown) such as an oscillator or phase locked loop, such as a fractional-N or integer-N frequency synthesizer. In some examples, the controller 106 receives the output clock from the clock divider 102. In other examples, the electronic device 100 includes a component 108. The component 108 may couple to the clock divider 102 and receive the output clock signal from the clock divider 102. In various examples, the component 108 is any suitable component, such as a radio transceiver, a frequency divider, a phase-locked loop (e.g., such as fractional-N or integer-N frequency synthesizer), a component useful in communication or other signaling, or any other component which may benefit from receiving an output clock signal having a frequency that varies from the input clock and is set with high resolution.

Figure 2:
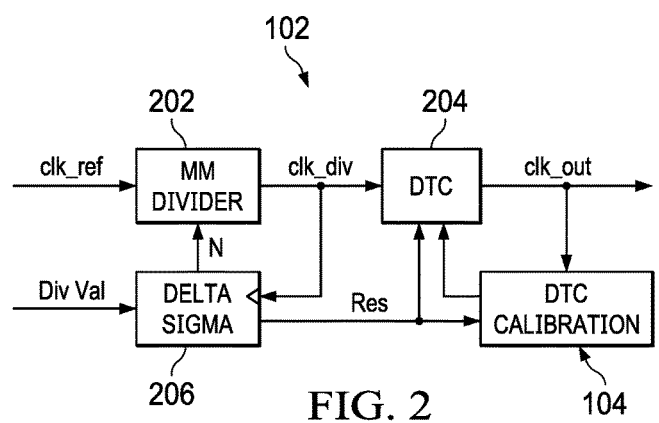
FIG. 2 is a block diagram of a clock divider with a calibration circuit, in accordance with various examples.

FIG. 2 is a block diagram of the clock divider 102 with the calibration circuit 104, in accordance with various examples. In some examples, the clock divider 102 as shown in FIG. 2 is an open loop FOD. In some examples, the clock divider 102 includes a multi-modulus (M) divider 202, a digital delta-sigma modulator 206, a DTC 204, and the calibration circuit 104. In some examples, the MN divider 202 has a first input configured to receive an input clock signal, such as a reference clock signal, indicated in FIG. 2 as clk_ref. The MN divider 202 also has a second input and an output. The delta-sigma modulator 206 has a first input configured to receive a divide value that includes integer and fractional components, indicated in FIG. 2 as Div Val. The divide value may be in a digital format or domain and is converted by the delta-sigma modulator 206 to a sequence of divide values, indicated in FIG. 2 as N, such that the average of the sequence corresponds to Div Val. The delta-sigma modulator 206 has a first output coupled to the second input of the MM divider 202 and provides N to the MM divider 202 via the coupling. The delta-sigma modulator 206 also includes a second input coupled to the output of the MM divider 202 and a second output. The DTC 204 has a first input coupled to the output of the MM divider 202, a second input coupled to the second output of the delta-sigma modulator 206, a third input, and an output. In some examples, the DTC 204 receives a residual error signal, indicated in FIG. 2 as Res, from the delta-sigma modulator 206. The DTC 204 provides an output clock signal, indicated in FIG. 2 as clk_out, at its output. The calibration circuit 104 has a first input coupled to the output of the DTC 204, a second input coupled to the second output of the delta-sigma modulator 206, and an output coupled to the third input of the DTC 204. In some examples, the calibration circuit 104 has a third input coupled to the output of the MM divider 202.

In an example of operation, the delta-sigma modulator 206 receives Div Val, determines, based on Div Val, N, and provides N to the MM divider 202. The delta-sigma modulator 206 further provides Res at its second output. The MM divider 202 receives clk_ref and N, and based thereon, provides a divided clock signal, indicated in FIG. 2 as clk_div. The DTC 204 receives clk_div and Res, and based thereon, provides clk_out. The calibration circuit 104 receives clk_div, clk_out, and Res, and based thereon, determines gain and INL error adjustment values for calibrating the clock divider 102 to mitigate gain and INL errors introduced into clk_out by the DTC 204. In some examples, the calibration circuit 104 also corrects for mismatch errors in the DTC 204, as described above, such as via a LUT.

Figure 3:
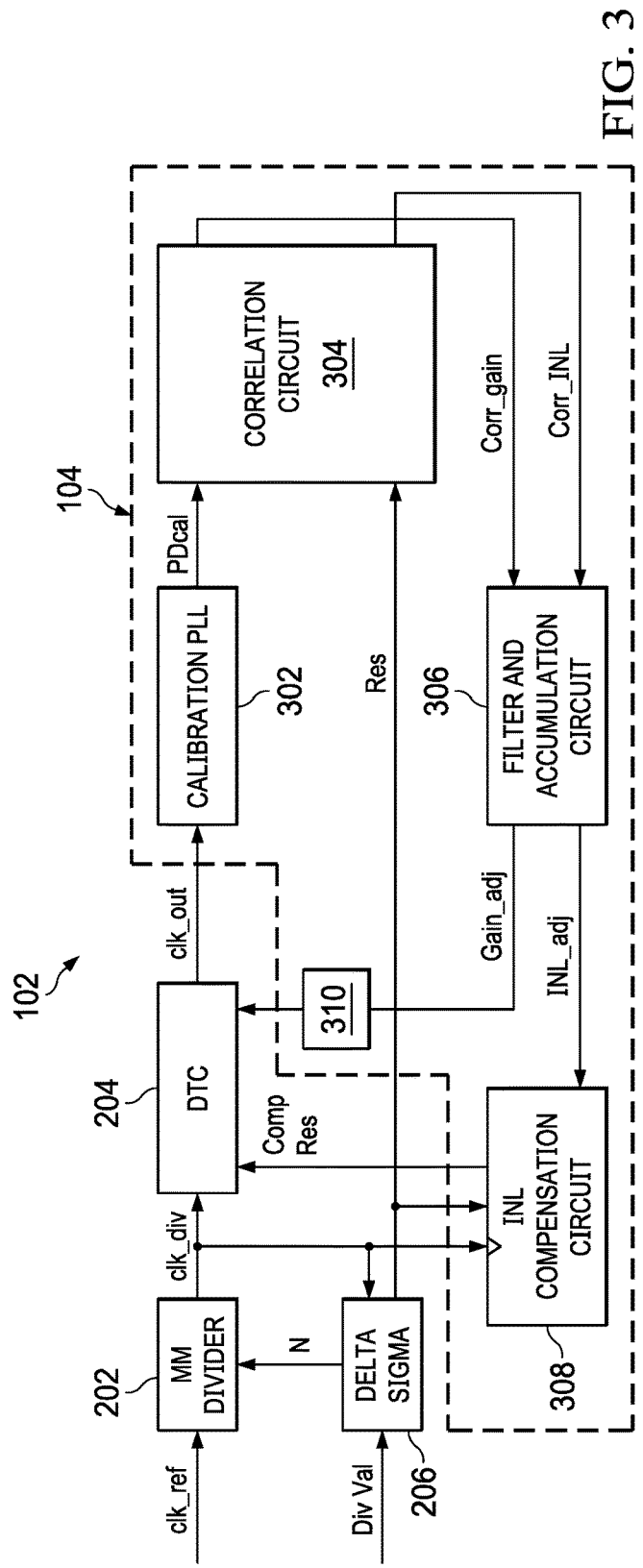
FIG. 3 is a block diagram of a clock divider with a calibration circuit, in accordance with various examples.

FIG. 3 is a block diagram of the clock divider 102 with the calibration circuit 104, in accordance with various examples. The clock divider 102 and the calibration circuit 104 are coupled and operate as described above with respect to FIG. 2, the description of which is not repeated with respect to FIG. 3. In some examples, the calibration circuit 104 includes a calibration phase-locked loop (PLL) 302, a correlation circuit 304, a filter and accumulation circuit 306, an INL compensation circuit 308, and a gain compensation circuit 310. The calibration PLL 302 has an input coupled to the output of the DTC 204 and an output. The correlation circuit 304 has a first input coupled to the output of the calibration PLL 302, a second input coupled to the second output of the delta-sigma modulator 206, a first output, and a second output. The filter and accumulation circuit 306 has a first input coupled to the first output of the correlation circuit 304, a second input coupled to the second output of the correlation circuit 304, a first output, and a second output. The INL compensation circuit 308 has a first input coupled to the output of the MN divider 202, a second input coupled to the second output of the delta-sigma modulator 206, a third input coupled to the second output of the filter and accumulation circuit 306, and an output coupled to the second input of the DTC 204. In some examples, the coupling between the output of the INL compensation circuit 308 and the second input of the DTC 204 replaces the coupling between the second output of the delta-sigma modulator 206 and the second input of the DTC 204, described above with respect to FIG. 2. The gain compensation circuit 310 has an input coupled to the first output of the filter and accumulation circuit 306 and an output coupled to the third input of the DTC 204, In some examples, a LUT (not shown) is coupled between the second output of the delta-sigma modulator 206 and the DTC 204 to correct for mismatch errors in the DTC.

In an example of operation, the calibration PLL 302 receives clk_out and determines a phase error signal, indicated in FIG. 3 as PDcal, based on clk_out. PDcal provides an instantaneous phase error of clk_out to correlation circuit 304, which performs a correlation based on PDcal, Res, and basis functions for gain error and INL error. In some applications, PDcal indicates whether the phase error is positive or negative, such as may be determined by a bang-bang phase detector (not shown), or any other suitable component. PDcal is then correlated with a signal based on Res and basis functions. For example, Res is mapped by the correlation circuit 304 according to one or more basis functions, the resulting signals of which may be filtered and may have an offset applied. In some examples, the filtering is high-pass in nature. In some examples, filtering and offset application are optional and either may be omitted. The correlation is subsequently performed by the correlation circuit 304, which first multiplies PDcal by the signals created by mapping Res according to one or more basis functions and then filters by a correlation filter of the correlation circuit 304 to obtain correlation error values. For example, based on the correlation, the correlation circuit 304 provides a gain correlation error value (Corr_gain) and an INL correlation error value (Corr_INL). The filter and accumulation circuit 306 receives the gain correlation error value and the INL correlation error value and determines a gain adjustment value (Gain_adj) and an INL adjustment value (INL_adj). The filter and accumulation circuit 306 provides Gain_adj to the DTC 204 and provides INL_adj to the INL compensation circuit 308. In some examples, Gain_adj is provided to a delta-sigma digital-to-analog converter (DAC) (not shown) of the gain compensation circuit 310 to control the DTC 204 to correct for the determined gain error. For example, a resistance, current, voltage, or capacitance of the DTC 204 may be modified according to Gain_adj to correct for the determined gain error. The INL compensation circuit 308 receives clk_div (such as for clocking operation of the INL compensation circuit 308), Res, and INL_adj and, based thereon, determines a compensation residual error signal. In some examples, the INL compensation circuit 308 includes an adder that adds INL_adj to Res to determine the compensation residual error signal. The INL compensation circuit 308 may also include registers that store data associated with determination of the compensation residual error signal and the registers may be clocked by clk_div. The compensation residual error signal may be determined by the INL compensation circuit 308 via computation (e.g., such as via an adder, as described above), a LUT, or both, based on its received input signals. The INL compensation circuit 308 provides the compensation residual error signal to the DTC 204. In other examples, the addition of INL_adj and Res is performed within the DTC 204 such that the INL compensation circuit 308 is omitted and the DTC 204 directly receives INL_adj in place of the compensation residual error signal. Based on the compensation residual error signal and Gain_adj, the DTC 204 applies compensation to the determination and providing of clk_out, reducing the effect of gain error and/or INL error of the DTC 204 on a value of clk_out.

Figure 4:
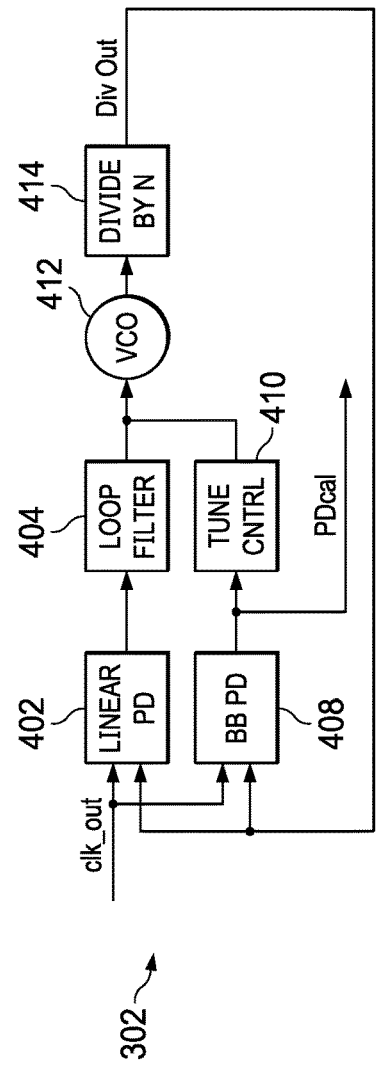
FIG. 4 is a block diagram of a calibration phase-locked loop (PLL), in accordance with various examples.

FIG. 4 is a block diagram of the calibration PLL 302, in accordance with various examples. In some examples, the calibration PLL 302 includes a linear phase detector (PD) 402, a loop filter 404, a bang-bang phase detector (BB PD) 408, a tune control circuit 410, a voltage-controlled oscillator (VCO) 412, a divider 414. In some examples, the linear PD 402 has a first input configured to receive clk_out (e.g., such as coupled to the output of the DTC 204 to receive clk_out), a second input, and an output. The loop filter 404 has an input coupled to the output of the linear PD 402 and an output. The BB PD 408 has a first input configured to receive clk_out (e.g., such as coupled to the output of the DTC 204 to receive clk_out), a second input, and an output. The BB PD 408 provides PDcal at its output. The tune control circuit 410, which may be omitted in some implementations, has an input coupled to the output of the BB PD 408 and an output. The VCO 412 has an output and has an input coupled to the output of loop filter 404 or the tune control circuit 410, which could include analog circuits and/or digital logic. The divider 414 has an input coupled to the output of the VCO 412 and an output coupled to the second input of the linear PD 402 (unless it is omitted) and the second input of the BB PD 408. The divider 414 provides a divider output signal, indicated in FIG. 4 as Div Out, at its output.

In an example of operation, the linear PD 402 provides a frequency lock between clk_out and Div Out, maintaining a linear relationship between the two during steady-state operation of the calibration PLL 302. An output signal of the linear PD 402 is filtered by the loop filter 404 and provided to the VCO 412. The BB PD 408 shifts the phase of Div Out such that the BB PD 408 alternates between positive and negative phase error values during steady-state operation. As such, the BB PD 408 provides PDcal, indicating whether the phase error of clk_out is negative or positive with respect to Div Out. For example, a first value of PDcal indicates the phase error of clk_out is positive and a second value of PDcal indicates that the phase error of clk_out is negative. Accordingly, PDcal dithers between two output values having an approximately even probability of occurring during steady-state operation of the calibration PLL 302. For example, if PDcal more frequently indicates that the phase of clk_out is negative, the tune control circuit 410 sends a corrective signal to the VCO 412, which sums with the output of the loop filter 404, to shift the phase of VCO 412 to cause PDcal to achieve an approximately even probability of negative and positive values. Similar functionality is performed if PDcal more frequently indicates that the phase of clk_out is positive. The divider 414 divides the output signal of the VCO 412 by a programmed value to provide Div Out at the same frequency as clk_out while facilitating operation of the VCO 412 at a frequency within operational limits of the VCO 412.

Figure 5:
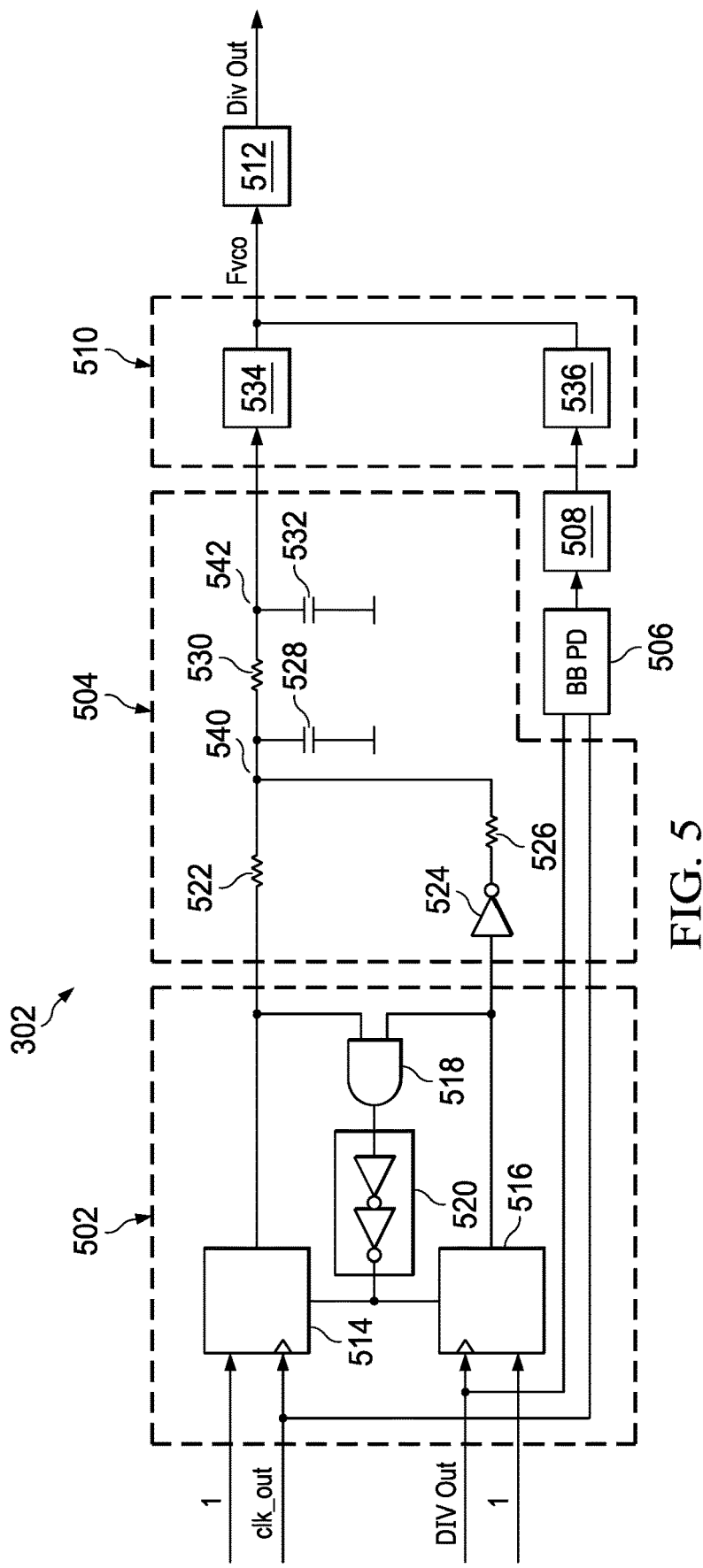
FIG. 5 is a block diagram of a calibration PLL, in accordance with various examples.

FIG. 5 is a block diagram of the calibration PLL 302, in accordance with various examples. In some examples, the calibration PLL 302 includes a linear PD 502, a loop filter 504, a BB PD 506, a tune control circuit 508, a VCO 510, and a divider 512. In some examples, the linear PD 502 includes a d-flip flop 514, a d-flip flop 516, an AND gate 518, and a delay circuit 520. The loop filter 504 includes a resistor 522, an inverter 524, a resistor 526, a capacitor 528, a resistor 530, and a capacitor 532. The VCO 510 includes a varactor 534 and a varactor 536. In some examples, the d-flip flop 514 has a data input that receives a logic 1 value, a clock input that receives clk_out, a reset input, and an output. The d-flip flop 516 has a data input that receives a logic 1 value, a clock input that receives Div Out, a reset input, and an output. The AND gate 518 has a first input coupled to the output of the d-flip flop 514, a second input coupled to the output of the d-flip flop 516, and an output. The delay circuit 520 has an input coupled to the output of the AND gate 518, and an output coupled to the reset inputs of the d-flip flop 514 and the d-flip flop 516. The resistor 522 is coupled between the output of the d-flip flop 514 and a node 540. The inverter 524 has an input coupled to the output of the d-flip flop 516 and an output coupled through the resistor 526 to the node 540. The capacitor 528 is coupled between the node 540 and a ground voltage potential. The resistor 530 is coupled between the node 540 and a node 542. The capacitor 532 is coupled between the node 542 and the ground voltage potential. The varactor 534 has an input coupled to the node 542 and an output. The varactor 536 has an input coupled to the output of the tune control circuit 508 and an output. Output signals provided at respective outputs of the varactor 534 and the varactor 536 are summed to provide a signal, indicated in FIG. 5 as Fvco, having a frequency determined based on capacitances of the varactor 534 and the varactor 536. The linear PD 502 and the loop filter 504 allows phase and frequency locking of Div Out to clk_out according to linear dynamics, while the BB PD 506 and tune control circuit 508 provide phase alignment of clk_out and Div Out such that PDcal dithers between two output values having an approximately even probability of occurring during steady-state operation, as described above.

Figure 6:
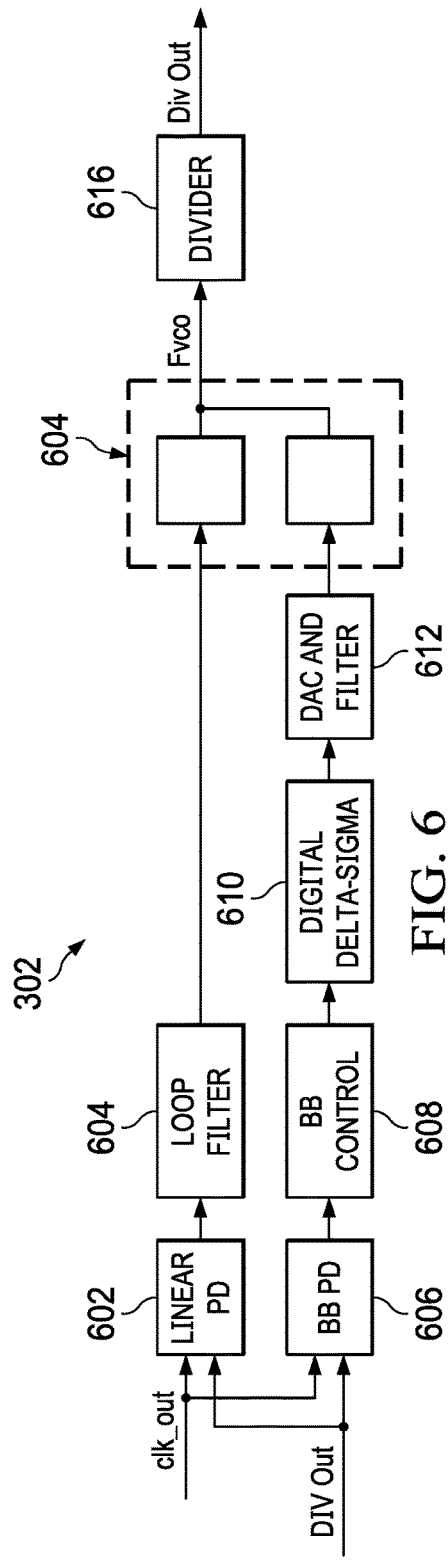
FIG. 6 is a block diagram of a calibration PLL, in accordance with various examples.

FIG. 6 is a block diagram of the calibration PLL 302, in accordance with various examples. In some examples, the calibration PLL includes a linear PD 602, a loop filter 604, a BB PD 606, a BB control circuit 608, a digital delta-sigma DAC 610, a DAC and filter circuit 612, a VCO 614, and a divider 616. In some examples, the VCO 614 is substantially similar to the VCO 510 of FIG. 5, the description of which is not repeated herein with respect to FIG. 6. In some examples, the linear PD 602, the loop filter 604, the BB PD 606, and the divider 616 are substantially similar to the linear PD 402, the loop filter 404, the BB PD 408, and the divider 414, described above with respect to FIG. 4, the description of which is not repeated herein with respect to FIG. 6. The BB control circuit 608 has an input coupled to the output of the BB PD 606 and an output. The digital delta-sigma modulator 610 has an input coupled to the output of the BB control circuit 608 and an output. The DAC and filter circuit 612 has an input coupled to the output of the digital delta-sigma modulator 610 and an output coupled to the VCO 614.

In an example of operation, the BB control circuit 608 provides a BB tuning signal based on PDcal as provided by BB PD 606. The BB control circuit 608 may provide the BB tuning signal according to any suitable processing, such as via a decimator, accumulator, gear shifting, etc. The digital delta-sigma modulator 610 and the DAC and filter circuit 612 convert the BB tuning signal from a digital format or domain to an analog signal suitable for controlling the VCO 614. In some examples, DAC and filter circuit 612 may be omitted and the VCO 614 may include an array of capacitors (not shown) coupled to digital delta-sigma modulator 610 to achieve a more digital implementation for providing the BB tuning signal.

Figure 7:
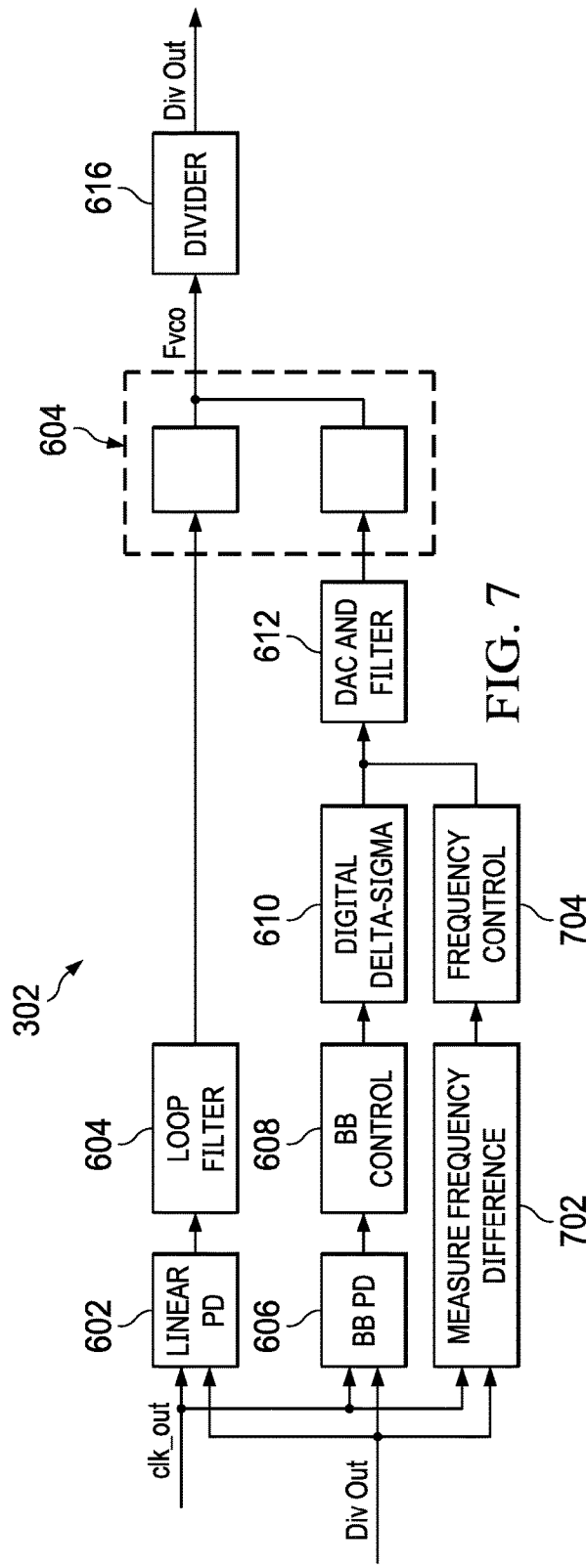
FIG. 7 is a block diagram of a calibration PLL, in accordance with various examples.

FIG. 7 is a block diagram of the calibration PLL 302, in accordance with various examples. In some examples, the calibration PLL 302 of FIG. 7 includes the elements of the calibration PLL 302 of FIG. 6, and are labeled accordingly. The description of these components is not repeated herein with respect to FIG. 7. The calibration PLL 302 also includes a measurement circuit 702 and a frequency control circuit 704. The measurement circuit 702 has a first input configured to receive clk_out, a second input coupled to the output of the divider 616, and an output. The frequency control circuit 704 has an input coupled to the output of the measurement circuit 702 and an output coupled to the input of the DAC and filter circuit 612. The measurement circuit 702 and the frequency control circuit 704 form an auxiliary frequency control path that increases a frequency tuning range of the VCO 614. In some examples, the DAC and filter circuit 612 may be omitted and the VCO 614 may include an array of capacitors coupled to the digital delta-sigma modulator 610 and the frequency control circuit 704 to achieve a more digital implementation for providing the BB tuning signal and auxiliary frequency control path.

Figure 8:
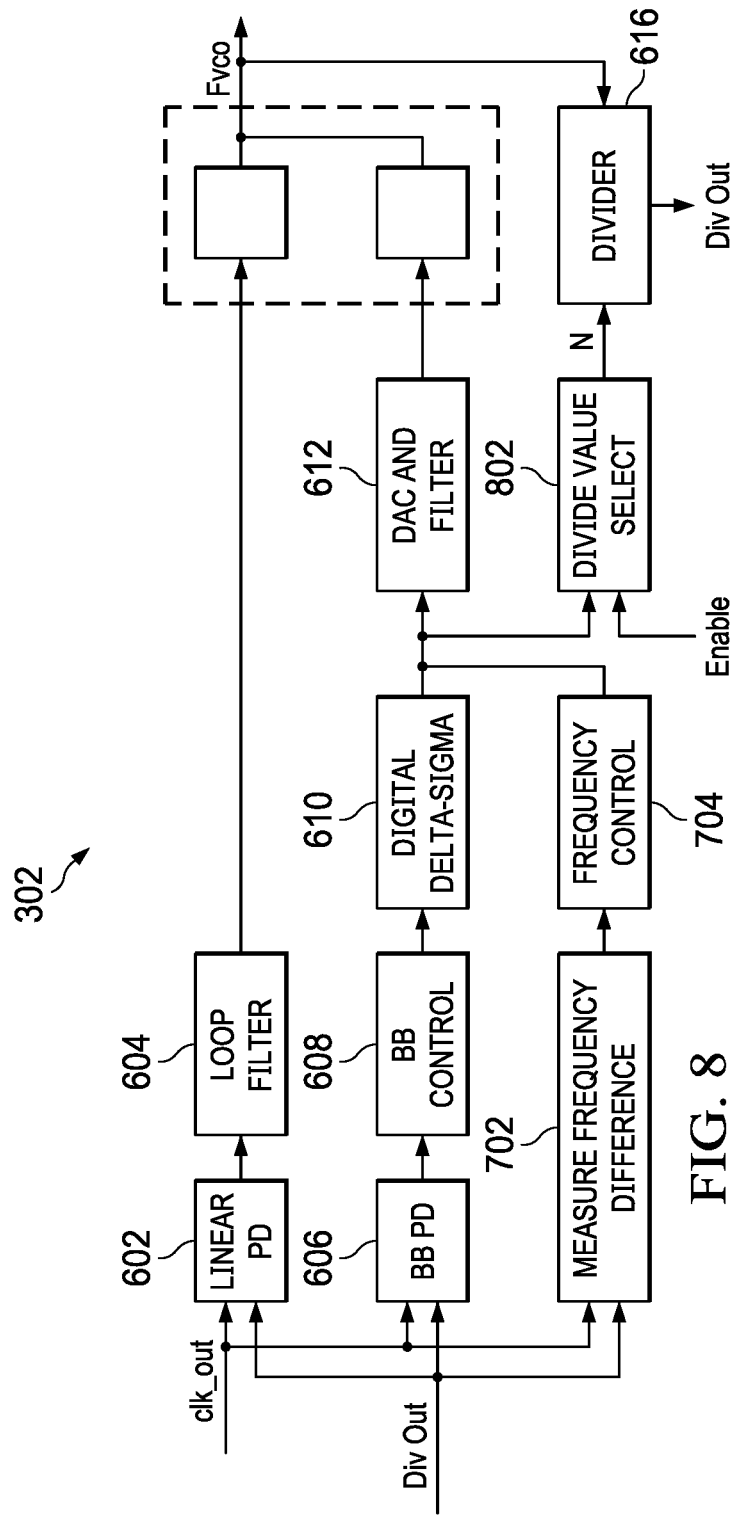
FIG. 8 is a block diagram of a calibration PLL, in accordance with various examples.

FIG. 8 is a block diagram of the calibration PLL 302, in accordance with various examples. In some examples, the calibration PLL 302 of FIG. 8 includes the elements of the calibration PLL 302 of FIG. 7, and are labeled accordingly. The description of these components is not repeated herein with respect to FIG. 8. The calibration PLL 302 also includes a divide value selection circuit 802. The divide value selection circuit 802 has a first input coupled to the input of the DAC and filter circuit 612, a second input configured to receive a enable signal, and an output coupled to the divider 616. In some examples, the divide value selection circuit 802 selects a value by which the divider 616 divides an output signal of the VCO 614 such that the BB tuning signal is kept within a programmed range of limits of the VCO 614, such as to achieve proper operation for frequency control of the VCO 614.

Figure 9:
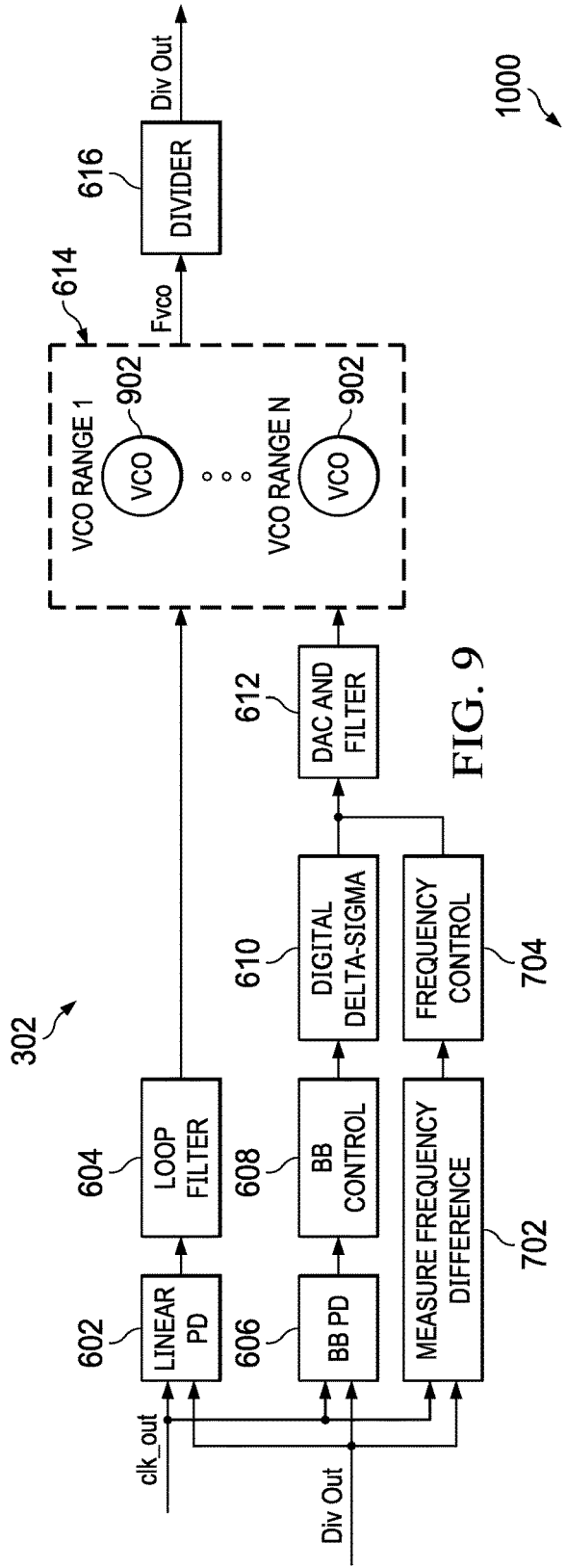
FIG. 9 is a block diagram of a calibration PLL, in accordance with various examples.

FIG. 9 is a block diagram of the calibration PLL 302, in accordance with various examples. In some examples, the calibration PLL 302 of FIG. 9 includes some of the elements of the calibration PLL 302 of FIG. 7, and are labeled accordingly. The description of these components is not repeated herein with respect to FIG. 9. The calibration circuit 302 includes multiple VCOs 902, each of which may be coupled as the VCO 614. In some examples, a VCO of the VCOs 902 that operates at a lowest frequency suitable for a particular application of the calibration PLL 302 may provide a VCO output signal, thereby reducing power consumption of the calibration PLL 302 in comparison to other examples, such as those of FIGS. 6-9.

Figure 10:
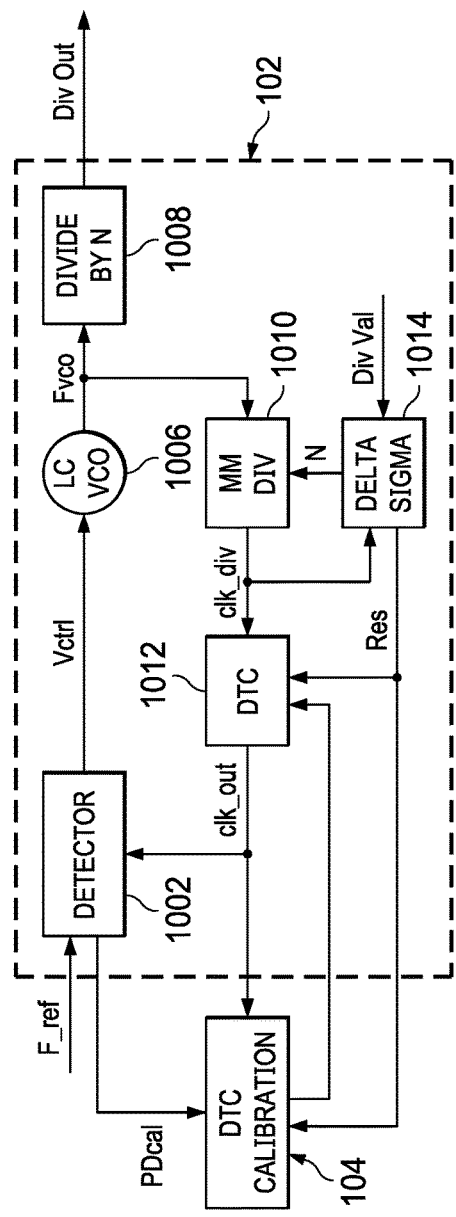
FIG. 10 is a block diagram of a PLL that includes a clock divider with a calibration circuit, in accordance with various examples.

FIG. 10 is a block diagram of a PLL 1000 that includes the clock divider 102 with the calibration circuit 104, in accordance with various examples. In some examples, the PLL 1000 includes the clock divider 102 within its closed loop feedback and performs frequency multiplication from F_ref to Fvco according to Div Val. In some examples, the PLL 1000 includes detector 1002, a VCO 1006, a divider 1008, a MM divider 1010, a DTC 1012, and a delta-sigma modulator 1014. In some examples, the PLL 1000 of FIG. 10 may provide filtering, via the detector 1002, of jitter introduced by the DTC 1012 that is not provided by the clock divider 102 of FIG. 2, described above herein.

In an example implementation, the detector 1002 has a first input configured to receive a reference signal F_ref, a second input, a first output, and a second output. The VCO 1006 has an input coupled to the first output of the detector 1002 and an output. The divider 1008 has an input coupled to the output of the VCO 1006 and an output at which the divider 1008 is configured to provide clk_out. In some implementations, the divider 1008 may be omitted in examples in which high output signal frequencies are to be provided by the PLL 1000. In some examples, the divider 1008 may include multiple frequency dividers to create multiple output signals which may be at different frequencies. The MM divider 1010 has a first input coupled to the output of the VCO 1006, a second input, and an output. The DTC 1012 has a first input coupled to the output of the MM divider 1010, a second input, a third input, and an output coupled to the second input of the detector 1002. The delta-sigma modulator 1014 has an input coupled to the output of the MM divider 1010, a first output coupled to the second input of the MM divider 1010, and a second output. The calibration circuit 104 has a first input coupled to the second output of the detector 1002, a second input coupled to the second output of the delta-sigma modulator 1014, and an output coupled to the DTC 1012.

In an example of operation of the PLL 1000, the detector 1002 compares an output of the DTC 1012, indicated in FIG. 10 as clk_out, to F_ref. Based on the comparison, the detector 1002 provides PDcal to the calibration circuit 104 and a control signal, indicated in FIG. 10 as Vctrl, that is provided to the VCO 1006 to achieve phase lock at steady state. A frequency of an output signal of the VCO 1006 is determined by the frequency of F_ref multiplied by Div Val. Fvco, as provided by the VCO 1006, may be directly provided as an output of the PLL 1000, or may be divided down to one or more frequencies by divider 1008. Also, PLL 1000 may omit a calibration PLL and provide filtering of high frequency noise introduced by the DTC 1012.

The MM divider 1010 receives the output of the VCO 1006 and receives N from the delta-sigma modulator 1014, and based thereon, provides a divided clock signal, indicated in FIG. 10 as clk_div. The DTC 1012 receives clk_div and calibration signals, and based thereon, provides clk_out. The calibration circuit 104 receives PDcal from the detector 1002 and receives Res from the delta-sigma modulator 1014, and based thereon, performs correlations according to basis functions that are each a function of Res, as described above herein, to determine and provide the calibration signals. Based on the calibration signals, the DTC 1012 applies compensation to the determination and providing of clk_out, reducing the effect of gain error and/or INL error of the DTC 1012 on a value of clk_out. In some examples, the PLL 1000 continually adjusts the calibration signals provided by the calibration circuit 104 such that correlation values determined by the compensation circuit for gain and INL errors of the DTC 1012 converge to an average of zero.

Figure 11:
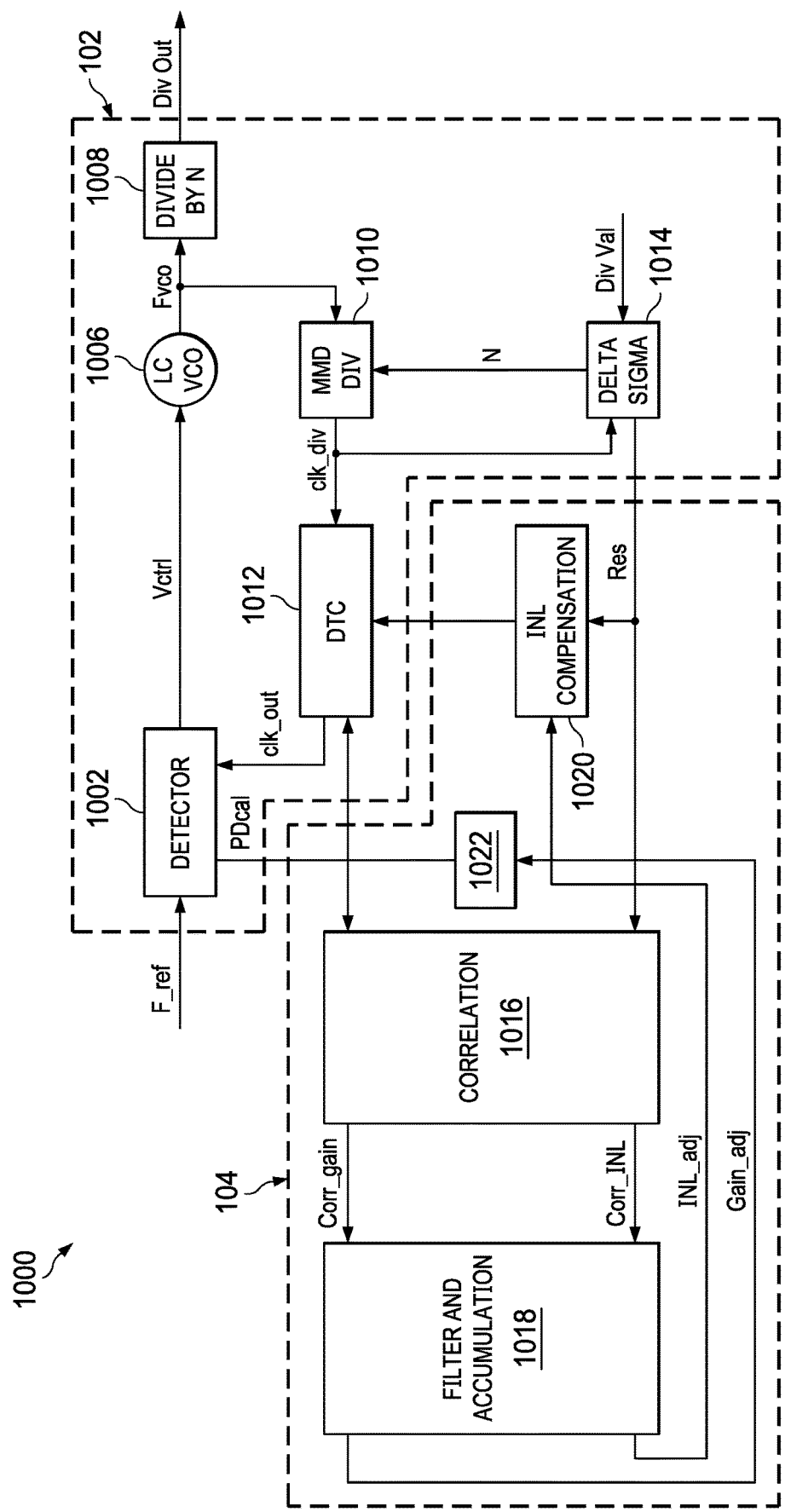
FIG. 11 is a block diagram of a PLL that includes a clock divider with a calibration circuit, in accordance with various examples.

FIG. 11 is a block diagram of the PLL 1000 with the calibration circuit 104, in accordance with various examples. The PLL 1000 is coupled and operates as described above with respect to FIG. 10, some of the description of which is not repeated with respect to FIG. 11. In some examples, the calibration circuit 104 includes a correlation circuit 1016, a filter and accumulation circuit 1018, an INL compensation circuit 1020, and a gain compensation circuit 1022.

In an example implementation, the detector 1002 has a first input configured to receive F_ref, a second input, a first output, and a second output. The VCO 1006 has an input coupled to the first output of the detector 1002 and an output. The divider 1008 has an input coupled to the output of the VCO 1006 and an output at which the divider 1008 is configured to provide clk_out. In other examples, the divider 1008 is omitted as Fvco is provided as clk_out. The MN divider 1010 has a first input coupled to the output of the VCO 1006, a second input, and an output. The DTC 1012 has a first input coupled to the output of the MN divider 1010, a second input, a third input, and an output coupled to the second input of the detector 1002. The delta-sigma modulator 1014 has an input coupled to the output of the MN divider 1010, a first output coupled to the second input of the MN divider 1010, and a second output. The correlation circuit 1016 has a first input coupled to the second output of the detector 1002, a second input coupled to the second output of the delta-sigma modulator 1014, a first output, and a second output. The filter and accumulation circuit 1018 has a first input coupled to the first output of the correlation circuit 1016, a second input coupled to the second output of the correlation circuit 1016, a first output, and a second output. The INL compensation circuit 1020 has a first input coupled to the second output of the delta-sigma modulator 1014, a second input coupled to the second output of the filter and accumulation circuit 1018, and an output coupled to the third input of the DTC 1012. The gain compensation circuit 1022 has an input coupled to the first output of the filter and accumulation circuit 1018 and an output coupled to second input of the DTC 1012. In some examples, the gain compensation circuit 1022 functions substantially similar to the gain compensation circuit 310 of FIG. 3, and such description is not repeated again herein with respect to FIG. 10.

In an example of operation of the PLL 1000, the detector 1002 compares an output of the DTC 1012, indicated in FIG. 11 as clk_out, to a reference signal, indicated in FIG. 11 as F_ref. Based on the comparison, the detector 1002 provides PDcal to the correlation circuit 1016 and a control signal, indicated in FIG. 11 as Vctrl, to the VCO 1006. A frequency of Fvco is determined by the frequency of F_ref multiplied by the divide value of divider 1008, which is determined by a programmed value. Out, as provided by the VCO 1006, may be directly provided as an output of the PLL 1000, or may be divided down to one or more frequencies by divider 1008. Also, PLL 1000 may omit a calibration PLL and provide filtering of high frequency noise introduced by the DTC 1012.

The MM divider 1010 receives Fvco and receives N from the delta-sigma modulator 1014, and based thereon, provides a divided clock signal, indicated in FIG. 11 as clk_div. The DTC 1012 receives clk_div, a compensation residual error signal, and Gain_adj and based thereon, provides clk_out. The correlation circuit 1016 receives PDcal from the detector 1002 and receives Res from the delta-sigma DAC 1014, and based thereon, performs correlations according to basis functions that are each a function of Res, as described above herein, to determine and provide correlation values for gain and INL, respectively indicated in FIG. 11 as Corr_gain and Corr_INL. The filter and accumulation circuit 1018 receives Corr_gain and Corr_INL, and based thereon, determines gain and INL adjustment values, respectively indicated in FIG. 11 as INL_adj and Gain_adj. The INL compensation circuit 1020 receives Res and INL_adj, and based thereon, determines and provides the compensation residual error signal to the DTC 1012. Based on the compensation residual error signal and the Gain_adj, the DTC 1012 applies compensation to the determination and providing of clk_out, reducing the effect of gain error and/or INL error of the DTC 1012 on a value of clk_out. For example, the DTC 1012 may convert Gain_adj from a digital value to an analog value via a delta-sigma DAC (not shown) and control a resistance, current, voltage, or capacitance of the DTC 1012 based on the resulting analog value provided by the delta-sigma DAC to correct for the determined gain error. In some examples, the PLL 1000 continually adjusts the calibration signals provided by the calibration circuit 104 such that correlation values determined by the compensation circuit for gain and INL errors of the DTC 1012 converge to an average of zero. In some examples, a LUT (not shown) is coupled between the second output of the delta-sigma modulator 1014 and the DTC 1012 to provide correction for mismatch errors in the DTC 1012.

Figure 12:
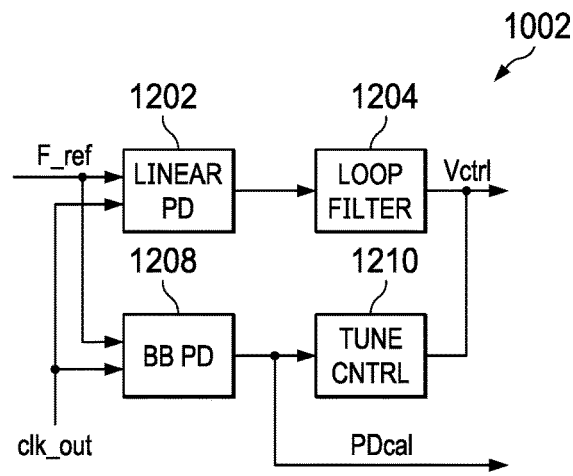
FIG. 12 is a block diagram of a detector, in accordance with various examples.

FIG. 12 is a block diagram of the detector 1002, in accordance with various examples. In some examples, the detector 1002 includes a linear PD 1202, a loop filter 1204, a BB PD 1208, and a tune control circuit 1210. In some examples, the linear PD 1202, loop filter 1204, BB PD 1208, and tune control circuit 1210 are coupled and operate substantially similar to the linear PD 402, loop filter 404, BB PD 408, and tune control circuit 410, described above with respect to FIG. 4, with the signal Div in FIG. 12 replacing the signal Div Out of FIG. 4. Accordingly, the description of these components is not repeated herein with respect to FIG. 12.

Figure 13:
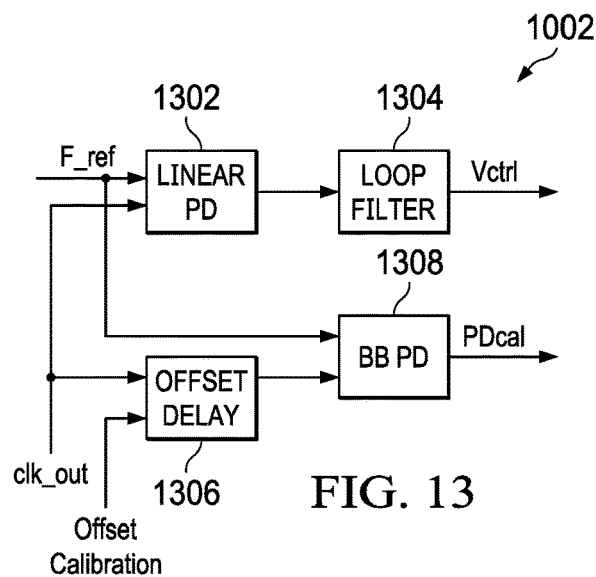
FIG. 13 is a block diagram of a detector, in accordance with various examples.

FIG. 13 is a block diagram of the detector 1002, in accordance with various examples. In some examples, the detector 1002 includes a linear PD 1302, a loop filter 1304, an offset delay circuit 1306, and a BB PD 1308. The linear PD 1302 has a first input configured to receive F_ref, a second input configured to receive Div, and an output. The loop filter 1304 has a first input coupled to the output of the linear PD 1302, and an output at which Vctrl is provided. The offset delay circuit 1306 has a first input configured to receive Div, a second input configured to receive an offset calibration signal, and an output. The BB PD 1308 has a first input configured to receive F_ref, a second input coupled to the output of the offset delay circuit 1306, and an output at which PDcal is provided.

In an example of operation, the linear PD 1302 provides phase lock between F_ref and Div, maintaining a steady-state phase error between F_ref and Div according to characteristics (including mismatch) of detector 1002. An output signal of the linear PD 1302 is filtered by the loop filter 1304 and provided as Vctrl. The offset delay circuit 1306 delays Div according to the offset calibration signal, which may be received from a control circuit (not shown) that monitors PDcal to shift the phase of Div such that PDcal eventually achieves an approximately even probability of negative and positive values during steady-state operation of the detector 1002. Based on the shifting, the BB PD 1308 provides PDcal, indicating whether the instantaneous phase of F_ref is negative or positive with respect to the delayed Div. For example, a first value of PDcal indicates that the phase of F_ref is negative and a second value of PDcal indicates that the phase of F_ref is positive.

Figure 14:
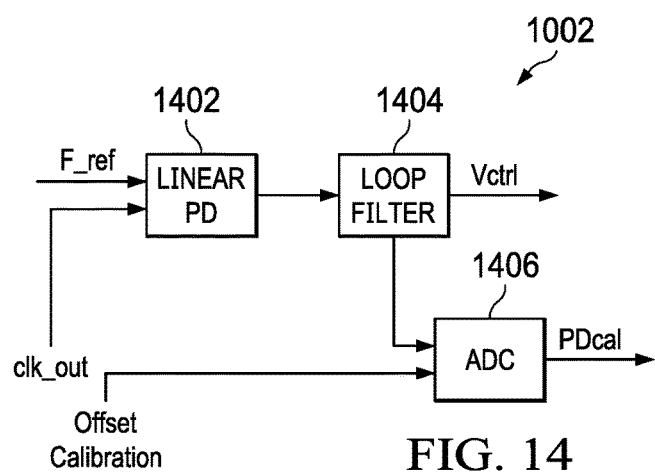
FIG. 14 is a block diagram of a detector, in accordance with various examples.

FIG. 14 is a block diagram of the detector 1002, in accordance with various examples. In some examples, the detector 1002 includes a linear PD 1402, a loop filter 1404, and an analog-to-digital converter (ADC) 1406. The linear PD 1402 has a first input configured to receive F_ref, a second input configured to receive Div, and an output. The loop filter 1404 has a first input coupled to the output of the linear PD 1402, a first output at which Vctrl is provided, and a second output. The ADC 1406 has a first input coupled to the second output of the loop filter 1404, a second input configured to receive an offset calibration signal, and an output at which PDcal is provided.

Figure 15:
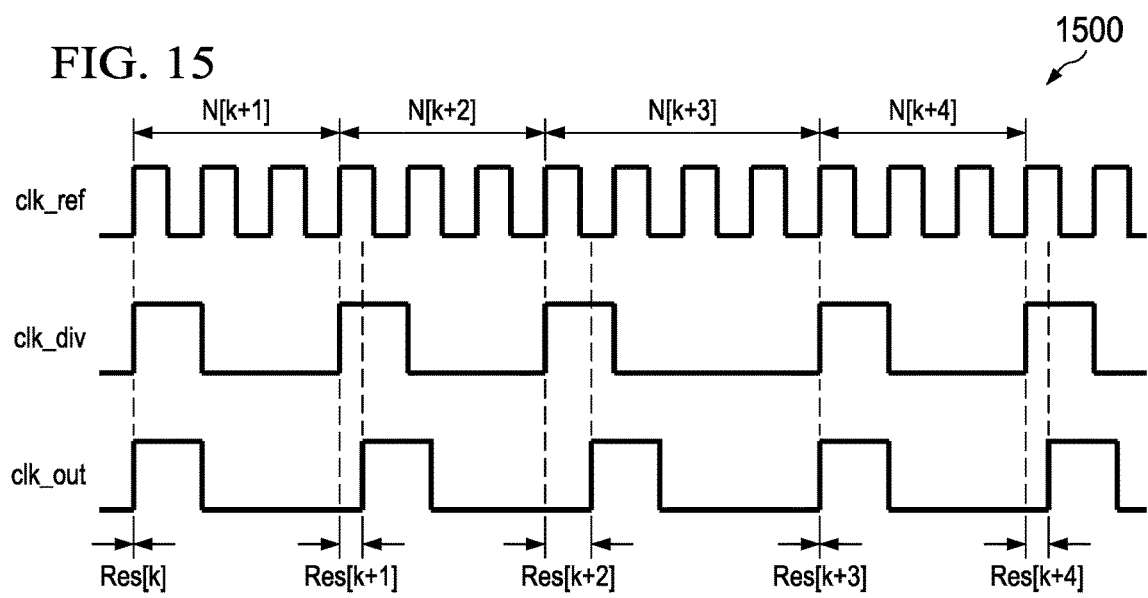
FIG. 15 is a timing diagram of signals in a clock divider, in accordance with various examples.

FIG. 15 is a timing diagram 1500 of signals in the clock divider 102, in accordance with various examples. The timing diagram 1500 shows clk_ref, clk_div, and clk_out, as described above herein. As shown by the diagram 1500, clk_div may have periods of different time duration (e.g., jitter) that are corrected by a DTC as controlled by Res and the described error correction techniques in forming clk_out.

Figure 16:
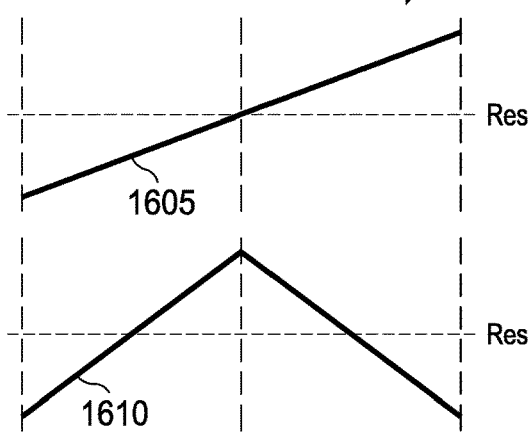
FIG. 16 is a diagram of basis functions, in accordance with various examples.

FIG. 16 is a diagram 1600 of basis functions that are less computationally complex to implement, in accordance with various examples. The diagram 1600 shows a gain basis function 1605 and an INL basis function 1610. In some examples, the gain basis function 1605 and the INL basis function 1610 are orthogonal and each have zero mean value. In other examples, the basis function 1605 and the basis function 1610 may be non-orthogonal and/or a non-zero mean component may be introduced.

Figure 17:
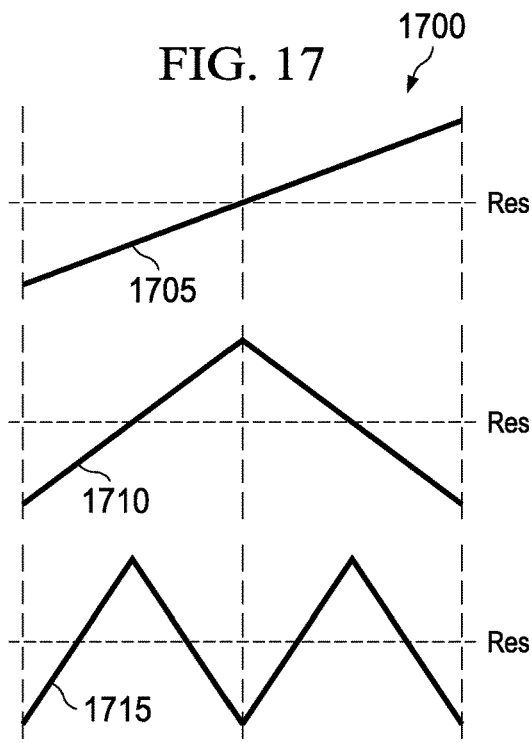
FIG. 17 is a diagram of expanded basis functions, in accordance with various examples.

FIG. 17 is a diagram 1700 of expanded basis functions, in accordance with various examples. The diagram 1700 shows a gain basis function 1705, a fundamental INL basis function 1710, and a $2^{nd}$ harmonic INL basis function 1715. In some examples, the gain basis function 1705, the fundamental INL basis function 1710, and the $2^{nd}$ harmonic INL basis function 1715 are orthogonal and each have zero mean value. In other examples, the basis function 1705, the basis function 1710, and the basis function 1715 may be non-orthogonal and/or a non-zero mean component may be introduced.

Figure 18:
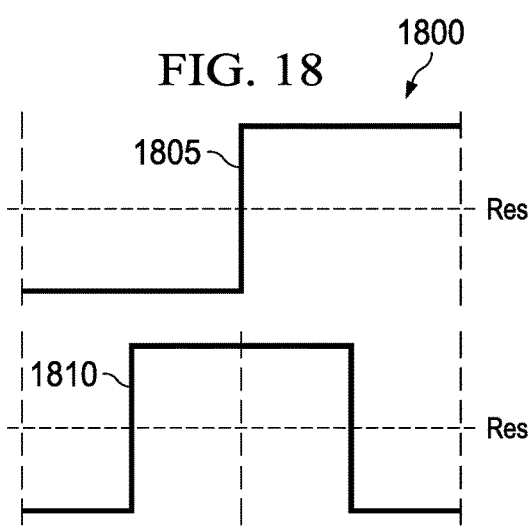
FIG. 18 is a diagram of simplified basis functions, in accordance with various examples.

FIG. 18 is a diagram 1800 of simplified basis functions, in accordance with various examples. The diagram 1800 shows a gain basis function 1805 and an INL basis function 1810. In some examples, the gain basis function 1805 and the INL basis function 1810 are orthogonal and each have zero mean value. In other examples, the basis function 1805 and the basis function 1810 may be non-orthogonal and/or a non-zero mean component may be introduced. In some examples, the simplified basis functions are computationally simpler (e.g., require less computational complexity and/or power) than the basis functions of FIG. 16 and/or FIG. 17. In other examples, more complex basis functions may be useful, such as if performance increases resulting from the more complex basis functions is worthwhile relative to the increased computational complexity and/or power associated with computation of the more complex basis functions.

Figure 19:
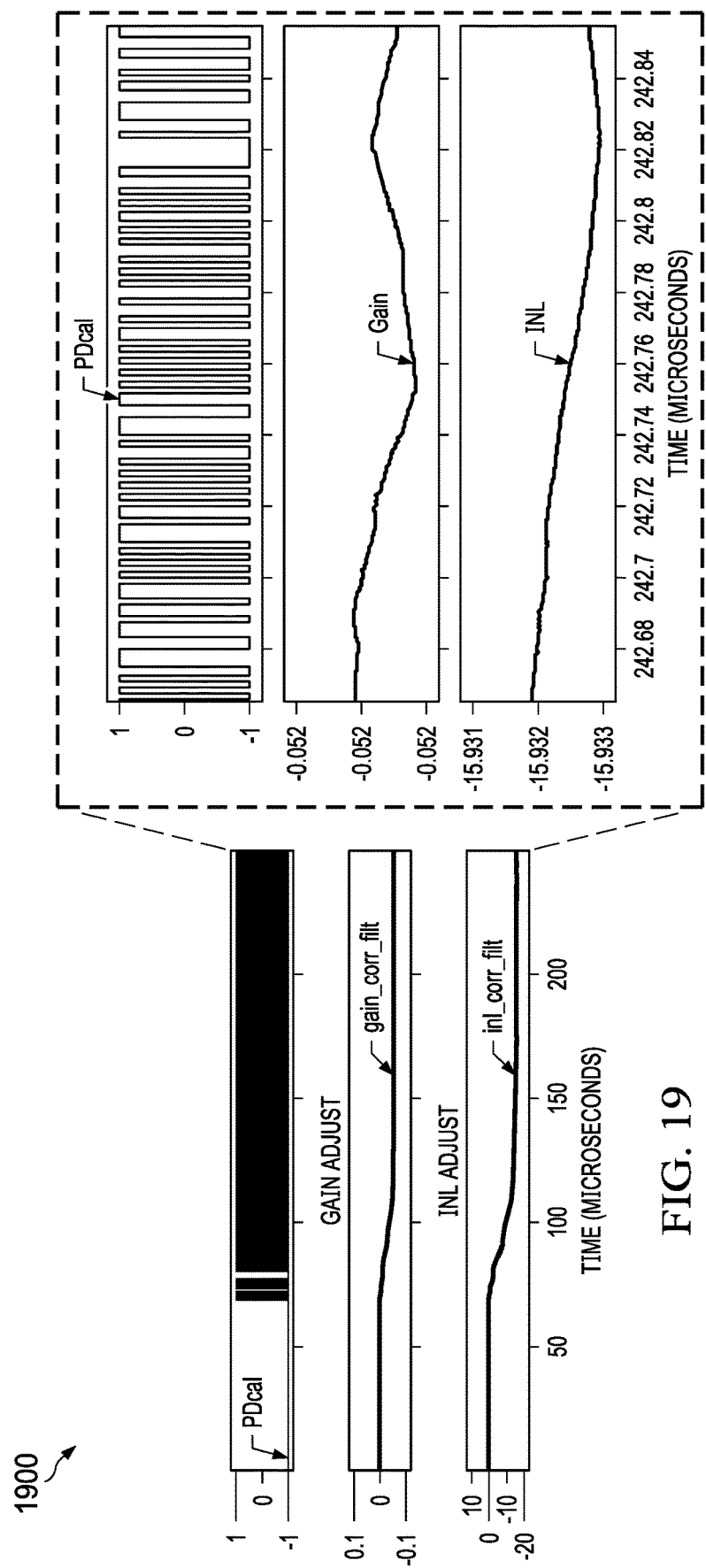
FIG. 19 is a transient simulation of gain and parametric integrated nonlinearity (INL) correction in a clock divider, in accordance with various examples.

FIG. 19 is a transient simulation 1900 of gain and INL correction in a clock divider, in accordance with various examples. In some examples, the clock divider is the clock divider 102, as described above herein. The transient simulation 1900 shows PDcal, Gain_adj, and INL_adj.

Figure 20A:
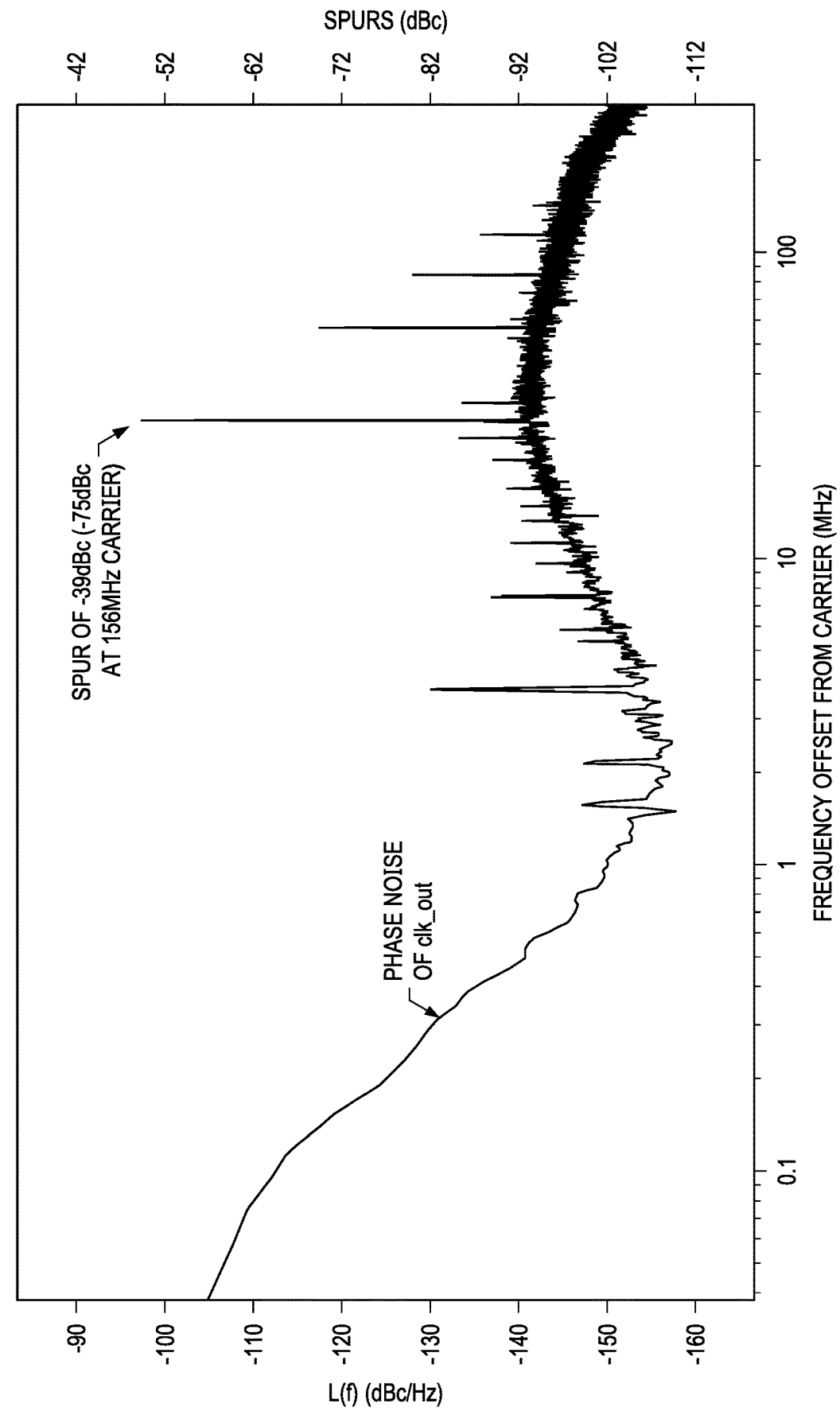
FIG. 20A is a phase noise spectrum in a clock divider with INL cancellation disabled, in accordance with various examples.

FIG. 20A is a phase noise spectrum 2000 of clk_out with INL cancellation disabled, in accordance with various examples. In some examples, clk_out is provided by the clock divider 102, as described above herein. As shown in FIG. 20A, the left-side vertical axis is representative of spectral density (L(f)) in units of decibels relative to the carrier (dBc) per Hertz (Hz), the right-side vertical axis is representative of dBc, and the horizontal axis is representative of a frequency offset from a carrier frequency, in terms of megahertz (MHz). As shown by the phase noise spectrum 2000, in some examples of the clock divider in which INL cancellation is disabled, a spur having a magnitude, which in this example is approximately −39 dBc, may be present at a carrier frequency of about 156 MHz.

Figure 20B:
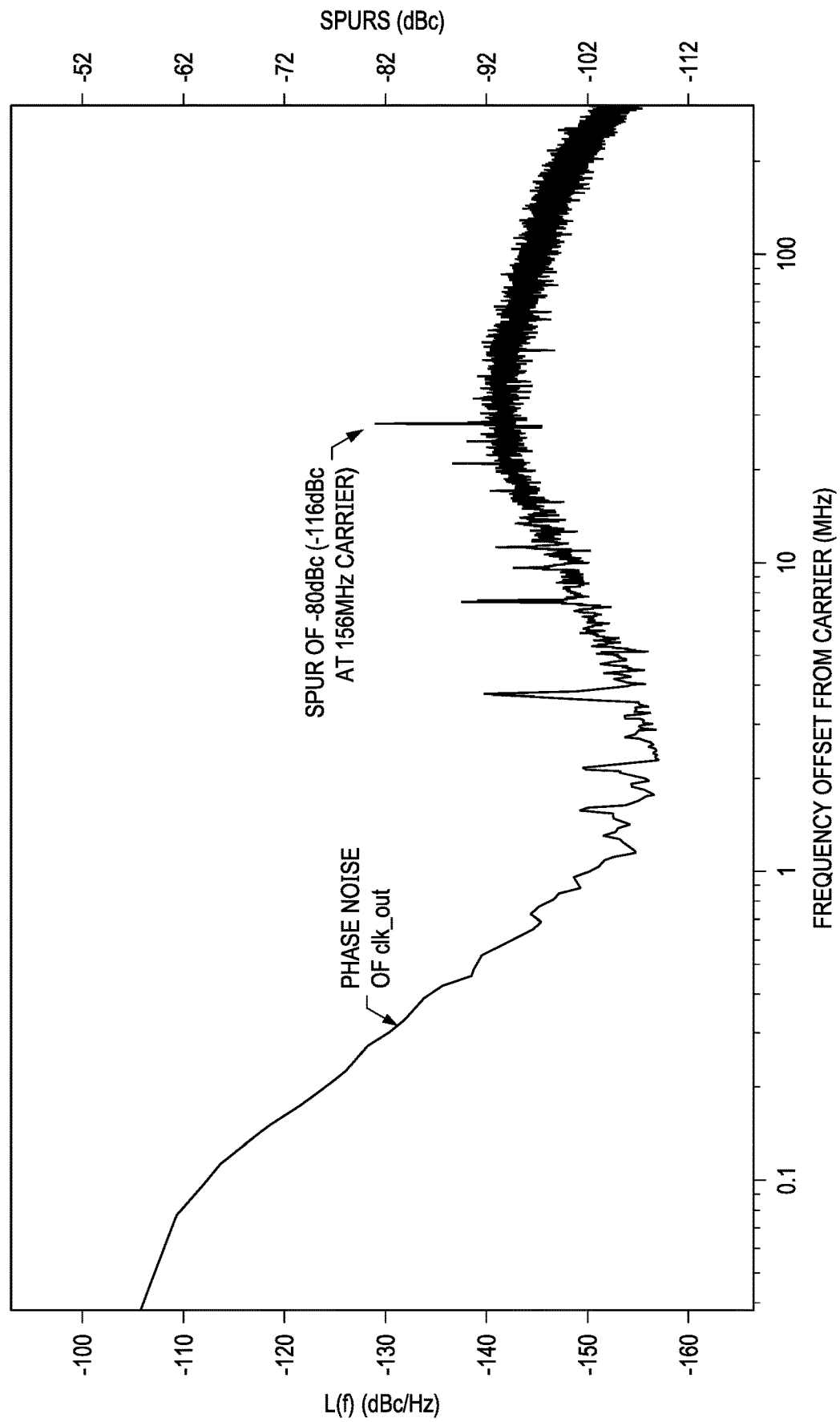
FIG. 20B is a phase noise spectrum in a clock divider with INL cancellation enabled, in accordance with various examples.

FIG. 20B is a phase noise spectrum 2005 of clk_out with INL cancellation enabled, in accordance with various examples. In some examples, clk_out is provided by the clock divider 102, as described above herein. A description of units of the axes of FIG. 20B may be the same as those of FIG. 20A. As shown by the phase noise spectrum 2005, in some examples of the clock divider in which INL cancellation is enabled, the spur shown in FIG. 20A is reduced, with this example showing reduction from approximately −39 dBc in value to approximately −80 dBc in value.

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

A device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to some of the passive elements and/or the sources to form the described structure either at a time of manufacture or after a time of manufacture, such as by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

The phrase "ground voltage potential" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

What is claimed is:

1. A circuit, comprising:
   a multi-modulus (MM) divider having an output and first and second inputs, in which the MM divider is configured to receive a clock signal at its first input;
   a delta-sigma modulator having first and second inputs and first and second outputs, in which the delta-sigma modulator is configured to receive a divide value at its first input, the second input of the delta-sigma modulator is coupled to the output of the MM divider, and the first output of the delta-sigma modulator is coupled to the second input of the MM divider;
   a digital-to-time converter (DTC) having an output and first, second and third inputs, in which the first input of the DTC is coupled to the output of the MM divider, and the second input of the DTC is coupled to the second output of the delta-sigma modulator; and
   a calibration circuit having an output and first and second inputs, in which the first input of the calibration circuit is coupled to the output of the DTC, the second input of the calibration circuit is coupled to the second output of the delta-sigma modulator, and the output of the calibration circuit is coupled to the third input of the DTC.

2. The circuit of claim 1, wherein the calibration circuit includes:
   a correlation circuit having first and second inputs and first and second outputs, in which the correlation circuit is configured to receive a phase error signal at its first input, and the correlation circuit second input of the correlation circuit is coupled to the second output of the delta-sigma modulator;

a feedback control circuit having first and second inputs and first and second outputs, in which the first input of the feedback control circuit is coupled to the first output of the correlation circuit, and the second input of the feedback control circuit is coupled to the second output of the correlation circuit;

a parametric integrated nonlinearity (INL) compensation circuit having an output and first, second and third inputs, in which the first input of the INL compensation circuit is coupled to the output of the MM divider, the second input of the INL compensation circuit is coupled to the second output of the delta-sigma modulator, the third input of the INL compensation circuit is coupled to the second output of the feedback control circuit, and the output of the INL compensation circuit is coupled to the second input of the DTC; and a gain compensation circuit having an input and an output, in which the input of the gain compensation circuit is coupled to the first output of the feedback control circuit, and the output of the gain compensation circuit is coupled to the third input of the DTC.

3. The circuit of claim 2, wherein the calibration circuit includes a calibration phase-locked loop (PLL) having an input and an output, the input of the PLL is coupled to the output of the DTC, the output of the PLL is coupled to the first input of the correlation circuit, the PLL is configured to provide the phase error signal at its output, and the calibration PLL includes:

a linear phase detector (PD) having an output and first and second inputs, in which the first input of the linear PD is coupled to the output of the DTC;

a loop filter having an input and an output, in which the input of the loop filter is coupled to the output of the linear PD;

a bang bang phase detector (PD) having an output and first and second inputs, in which the first input of the bang bang PD is coupled to the output of the DTC, and the output of the bang bang PD is coupled to the first input of the correlation circuit;

a tune control circuit having an input and an output, in which the input of the tune control circuit is coupled to the output of the bang bang PD;

a voltage-controlled oscillator (VCO) having an input and an output, in which the input of the VCO is coupled to the output of the loop filter and to the output of the tune control circuit; and a divider having an input and an output, in which the input of the divider is coupled to the output of the VCO, and the output of the divider is coupled to the second input of the linear PD and to the second input of the bang bang PD.

4. The circuit of claim 1, further comprising:

a detector circuit having first and second inputs and first and second outputs, in which the detector circuit is configured to receive a reference signal at its first input, and the second input of the detector circuit is coupled to the output of the DTC; and a voltage-controlled oscillator (VCO) having an input and an output, in which the input of the VCO is coupled to the second output of the detector circuit, and the output of the VCO is coupled to the first input of the MM divider.

5. The circuit of claim 4, wherein the calibration circuit includes:

a correlation circuit having first and second inputs and first and second outputs, in which the first input of the correlation circuit is coupled to the first output of the detector circuit, and the second input of the correlation circuit is coupled to the second output of the delta-sigma modulator;

a feedback control circuit having first and second inputs and first and second outputs, in which the first input of the feedback control circuit is coupled to the first output of the correlation circuit, and the second input of the feedback control circuit is coupled to the second output of the correlation circuit;

a parametric integrated nonlinearity (INL) compensation circuit having an output and first, second and third inputs, in which the first input of the INL compensation circuit is coupled to the output of the MM divider, the second input of the INL compensation circuit is coupled to the second output of the delta-sigma modulator, the third input of the INL compensation circuit is coupled to the second output of the feedback control circuit, and the output of the INL compensation circuit is coupled to the second input of the DTC; and a gain compensation circuit having an input and an output, in which the input of the gain compensation circuit is coupled to the first output of the feedback control circuit, and the output of the gain compensation circuit is coupled to the third input of the DTC.

6. The circuit of claim 5, wherein the detector circuit includes:

a linear phase detector (PD) having an output and first and second inputs, in which the linear PD is configured to receive the reference signal at the first input, and the second input of the linear PD is coupled to the output of the DTC;

a loop filter having an input and an output, in which the input of the loop filter is coupled to the output of the linear PD, and the output of the loop filter is coupled to the input of the VCO;

a bang bang phase detector (PD) having an output and first and second inputs, in which the bang bang PD is configured to receive the reference signal at its first input, the second input of the bang bang PD is coupled to the output of the DTC, and the output of the bang bang PD is coupled to the first input of the correlation circuit; and a tune control circuit having an input and an output, in which the input of the tune control circuit is coupled to the output of the bang bang PD, and the output of the tune control circuit is coupled to the input of the VCO.

7. The circuit of claim 4, wherein the calibration circuit is configured to:

determine a phase error signal by comparing a signal from the output of the DTC to the reference signal;

determine correlation values by correlating the phase error signal to basis functions of a residual error of the delta-sigma modulator; and cause the correlation values to converge to a zero average by controlling gain and parametric integrated nonlinearity (INL) adjustments of the DTC based on the correlation.

8. The circuit of claim 1, wherein the calibration circuit is configured to:

determine a phase error signal by comparing a signal from the output of the DTC to a second clock signal;

determine correlation values by correlating the phase error signal to basis functions of a residual error of the delta-sigma modulator; and cause the correlation values to converge to a zero average by controlling gain and parametric integrated nonlinearity (INL) adjustments of the DTC based on the correlation.

9. A circuit, comprising:
a clock divider including a digital-to-time converter (DTC); and
a calibration circuit coupled to the clock divider, the calibration circuit configured to:
determine a gain error and a parametric integrated nonlinearity (INL) error of the DTC;
determine a gain adjustment value and an INL adjustment value to compensate for the gain error and the INL error; and
modify operation of the DTC according to the gain adjustment value and the INL adjustment value to correct for the gain error and the INL error.

10. The circuit of claim 9, wherein the calibration circuit is configured to determine the gain error and the INL error of the DTC by:
determining a phase error signal by comparing an output signal from the DTC to a reference signal;
determining correlation values by correlating the phase error signal to basis functions of a residual error of a delta-sigma modulator of the clock divider; and
causing the correlation values to converge to a zero average by determining the gain adjustment value and the INL adjustment value based on the correlation values.

11. The circuit of claim 10, wherein the calibration circuit includes a bang bang phase detector configured to determine the phase error signal by comparing the reference signal to the output signal from the DTC.

12. The circuit of claim 10, wherein the basis functions include at least one basis function for the gain error and at least one basis function for the INL error.

13. The circuit of claim 12, wherein the basis functions have zero direct current components.

14. The circuit of claim 12, wherein the basis functions include a first basis function for a fundamental frequency and a second basis function for a second harmonic frequency.

15. The circuit of claim 10, wherein the calibration circuit is configured to filter the basis functions before performing the correlation.

16. The circuit of claim 9, wherein the calibration circuit is configured to correct for a mismatch error of the DTC according to a look-up table.

17. A system, comprising:
a controller configured to provide a control signal;
a clock divider coupled to the controller, the clock divider including a digital-to-time converter (DTC) configured to modify a clock signal according to the control signal;
a calibration circuit coupled to the clock divider, the calibration circuit configured to:
determine a gain error and a parametric integrated nonlinearity (INL) error of the DTC;
determine a gain adjustment value and an INL adjustment value to compensate for the gain error and the INL error; and
modify operation of the DTC according to the gain adjustment value and the INL adjustment value to correct for the gain error and the INL error; and
a component coupled to the clock divider, the component configured to receive the modified clock signal from the clock divider and operate according to the modified clock signal.

18. The system of claim 17, wherein the calibration circuit is configured to determine the gain error and the INL error of the DTC by:
determining a phase error signal by comparing an output signal from the DTC to a reference signal;
determining correlation values by correlating the phase error signal to basis functions of a residual error of a delta-sigma modulator of the clock divider; and
causing the correlation values to converge to a zero average by determining the gain adjustment value and the INL adjustment value based on the correlation values.

19. The system of claim 18, wherein the calibration circuit includes a bang bang phase detector configured to determine the phase error signal by comparing the reference signal to the output signal from the DTC.

20. The system of claim 18, wherein the basis functions are orthogonal to each other, including at least one basis function for the gain error and at least one basis function for the INL error.

* * * * *